United States Patent [19]

Partovi

[11] Patent Number: 5,378,945
[45] Date of Patent: Jan. 3, 1995

[54] VOLTAGE LEVEL CONVERTING BUFFER CIRCUIT

[75] Inventor: Hamid Partovi, Mountain View, Calif.; Steven W. Butler, Marlboro, MA; Luan Q. Tran, Northborough, MA.

[73] Assignee: Digital Equipment Corporation, Maynard, Mass.

[21] Appl. No.: 97,781

[22] Filed: Jul. 26, 1993

[51] Int. Cl.⁶ .................................. H03K 19/0944
[52] U.S. Cl. .................................. 326/68; 326/121
[58] Field of Search ................ 307/443, 451, 475; 361/91

[56] References Cited

U.S. PATENT DOCUMENTS

| | | | |
|---|---|---|---|
| 4,935,649 | 6/1990 | Bloker | 307/451 |
| 4,963,765 | 10/1990 | Kadakia et al. | 307/451 |
| 5,057,712 | 10/1991 | Trinh et al. | 307/443 |
| 5,151,616 | 9/1992 | Komuro | 307/451 |

Primary Examiner—David R. Hudspeth
Assistant Examiner—Benjamin D. Driscoll
Attorney, Agent, or Firm—Robert J. Feltovic; Denis G. Maloney; Albert P. Cefalo

[57] ABSTRACT

A voltage level conversion buffer circuit including a first and a second transistor each having a gate, a drain, and a source. The drain of the first transistor and the gate of the second transistor are connected together to provide an input to the buffer circuit, and the gate of the first transistor and the drain of the second transistor are connected to a supply voltage. The sources of the first and second transistors are connected together to provide an output for the buffer circuit.

9 Claims, 2 Drawing Sheets

VOLTAGE LEVEL CONVERTING BUFFER CIRCUIT

BACKGROUND OF THE INVENTION

This invention relates generally to voltage level conversion buffers for integrated circuit components, and more particularly to a buffer circuit which converts a logic signal at a first voltage level to a logic signal at a second different voltage level.

As it is known in the art, as integrated circuit (IC) fabrication technology has advanced, the size of transistors has been reduced allowing more transistors to fit in a given IC area. In particular, one type of transistor commonly used is so called metal-oxide-semiconductor field-effect transistors (i.e., MOSFET). A MOSFET generally includes a source and a drain each coupled to an n-type (or p-type) region having a p-type (or n-type) channel between the two regions and a gate coupled to a dielectric layer used to isolate the gate from the channel. A voltage applied to the gate induces an electric field across the gate dielectric layer and modulates the free-carrier concentration in the channel region. MOSFETs are generally small and easy to fabricate, and significant improvements in switching speed and power consumption can be made if complementary-symmetry MOSFETs (i.e., CMOS devices; both NMOS and PMOS devices) are used.

One problem with a given IC having more transistors is an increase in the amount of power required by the circuit since each transistor will require switching current when it changes from an "on" state to an "off" state and when it changes from an "off" state to an "on" state. The resulting increase in the amount of power required can lead to higher component packaging costs, overall computer system costs, larger computer systems to accommodate higher air flow due to a related increase in the amount of heat to be dissipated due to the increase in power, and the inability to use the components in battery powered computer systems.

One technique used to reduce power consumption is to reduce the supply voltage provided to the transistors in the IC. Additionally, as the transistors become smaller, a reduced supply voltage may also be required to lower the electric fields across the transistor terminals which can cause various reliability problems.

However, despite the reduction in supply voltage it is generally desirable to provide transistors which are capable of conducting a maximum current flow equal to the maximum current flow through transistors using a higher supply voltage such that transistors using a reduced supply voltage level will have comparable switching times to transistors using a higher supply voltage level. In order to accomplish this, it is generally necessary to decrease the thickness of the gate dielectric layer and channel length of the transistor.

One problem associated with thinning the gate dielectric layer is that the potential for dielectric breakdown increases. When a transistor is on, the electric field between the gate and the channel area is related to the gate to source voltage drop, Vgs, divided by the thickness of the gate dielectric layer, Tdi. (Often the gate dielectric is silicon-dioxide and the thickness of the gate dielectric is designated Tox.) As Tdi is reduced, if the value of Vgs does not change, the value of the electric field increases which increases the potential for dielectric breakdown. When Vgs reaches a certain level which is safely above the operating range of the supply voltage and specific to the process technology used to produce the device, the electric field reaches a level termed the "critical electric field". At the critical electric field level, the gate dielectric will irreparably break down and permanently change from an insulator to a conductor (i.e., the transistor behaves as a resistive short). To prevent dielectric breakdown Vgs is generally kept less than or equal to the supply voltage. Thus, the asserted input signal voltage level provided by components using higher supply voltages, Vdd, cannot be directly applied to gates of transistors which must operate at a reduced supply voltage, Vddr.

One technique used to protect a component using a reduced supply voltage, Vddr, from input signals from a component using a higher supply voltage, Vdd, is shown in FIG. 1. A component 10 is shown coupled to an input terminal 12 of a component 14. Component 10 uses a supply voltage Vdd while component 14 uses a reduced supply voltage Vddr. Input terminal 12 is shown coupled to buffer circuit 16 which includes an NMOS transistor 18 having a drain 18d, a gate 18g, and a source 18s. The drain 18d is connected to input terminal 12, the gate 18g is connected to Vddr, and the source 18s is coupled to logic element 20. Logic element 20 is shown to include an NMOS transistor 22 and a PMOS transistor 24 connected in such a way as to provide an inverter. The source 18s of the NMOS transistor 18 is connected to the gates 22g, 24g of NMOS transistor 22 and PMOS transistor 24, respectively.

A transistor is on, and thus, capable of conducting current, when Vgs is greater than Vt. Since the gate 18g of transistor 18 is connected to Vddr, transistor 18 will conduct current until the voltage Vs at the source 18s plus Vt equals Vddr (i.e., Vgs=Vt). Thus, Vs at source 18s is limited to Vddr minus Vt when the asserted signal voltage level is greater than Vddr−Vt at input terminal 12.

One problem with the buffer circuit 16 of FIG. 1 is the development of a cross-current between the PMOS transistor 24 and NMOS transistor 22 due to the limitation on Vs at the source 18s. NMOS transistor 22 will be fully conducting when the gate to source voltage drop, Vgs, is equal to Vddr, and PMOS transistor 24 will be fully off when |Vgs| is less than |Vt|. Since the maximum value of Vs at source 18s is less than Vddr, NMOS transistor 22 will not be fully conducting and PMOS transistor 24 will not be fully off which causes a cross-current from PMOS transistor 24 to NMOS transistor 22 when an asserted input signal is applied to input terminal 12. This results in a DC current component through inverter 20, and thus, a standby power requirement in component 14, hereinafter referred to as a standby current.

As the number of logic elements having a cross-current increases, the aggregate standby current may be higher than a maximum allowable standby current and may cause significant standby power consumption. This type of component may not be readily usable in a battery powered system.

A technique used to reduce the cross-current discussed above is shown in FIG. 2 where the buffer circuit 16 of FIG. 1 is shown with the addition of a PMOS transistor 26 having a gate 26g, a drain 26d, and a source 26s. The output of inverter 20 is shown connected to gate 26g, while source 26s is connected to Vddr and drain 26d is connected to the output of buffer circuit 16 and input of inverter 20. PMOS transistor 26 is one technique used to increase the voltage level provided to gates 22g, 24g of inverter 20 when the input signal applied to input terminal 12 is asserted.

As mentioned above, when an asserted input signal is applied to input terminal 12, initially, the PMOS transistor 24 will not be fully off and the NMOS transistor 22g will not be fully on. However, the output of the inverter will be approximately a low output signal. The arrangement of FIG. 2 provides this low output signal to the gate 26g of PMOS transistor 26 which turns transistor 26 on and allows current to flow from source 26s to drain 26d such that the voltage level at drain 26d is increased to Vddr provided that the asserted voltage level applied to input terminal 12 is greater than or equal to Vddr−Vt which will be discussed more fully below. Raising the input voltage level of inverter 20 to Vddr prevents the cross-current discussed above in reference to the circuit of FIG. 1.

One problem with this technique is the possibility of a back-drive current to input terminal 12 when the voltage level of an asserted input signal applied to input terminal 12 is less than Vddr−Vt. If component 14 is used in a system where the maximum voltage level of an asserted input signal is less than Vddr−Vt, or if the range of values for an asserted input signal voltage level includes voltage levels of less than Vddr−Vt, a back-drive current may be generated from PMOS transistor 26 through transistor 18 to input terminal 12. If the input signal voltage level at input terminal 12 is less than Vddr−Vt and as described above, the voltage level of the gates 22g, 24g is driven toward Vddr, the transistor 18 will begin conducting current from source 18s to drain 18d, thus, producing a back-drive current to input terminal 12.

This back-drive of current will prevent PMOS transistor 26 from pulling up the inverter 20 input to Vddr, and thus, will not eliminate the cross-current discussed in reference to the circuit of FIG. 1. Further, this back-drive current may violate very small limits placed on component input pad leakage.

SUMMARY OF THE INVENTION

In accordance with the present invention, a voltage level converting buffer circuit for an integrated circuit component includes a first and a second transistor each having a gate, a drain, and a source. The drain of the first transistor and the gate of the second transistor are connected together to receive an input for the buffer circuit, and the gate of the first transistor and the drain of the second transistor are connected to a supply voltage. The sources of the first and second transistors are connected together to provide an output for the buffer circuit. With such an arrangement, the first transistor prevents the voltage level at the output of the buffer circuit from reaching a value above the supply voltage level, while the second transistor may pull-up the output of the buffer circuit to a level equal to the supply voltage level. Thus, the buffer circuit converts an asserted input signal voltage level into a maximum allowable asserted input signal voltage level which is sufficient to allow for maximum transistor current conduction within the low-power integrated circuit component transistors while maintaining switching speed and preventing transistor damage, a back-drive current, and a cross-current within the low-power component transistors.

BRIEF DESCRIPTION OF THE DRAWINGS

The above-mentioned and other features of the invention will now become more apparent by reference to the following description taken in connection with the accompanying drawings in which.

DETAILED DESCRIPTION OF THE PREFERRED EMBODIMENTS

Figure 3:
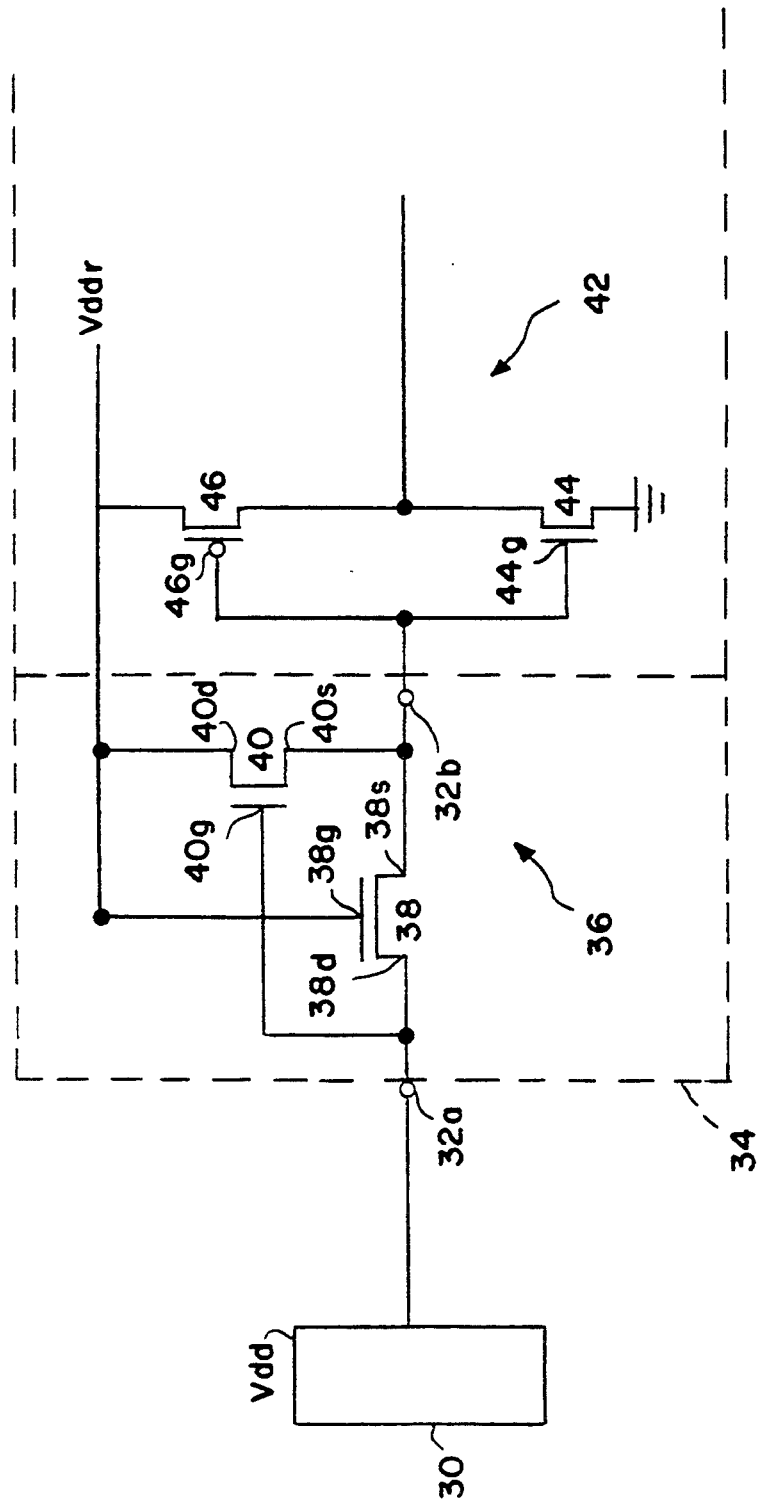
FIG. 3 is a schematic diagram of a voltage level converting buffer circuit for an integrated circuit component in accordance with the invention.

Referring now to FIG. 3, a component 30 is shown coupled to an input terminal 32a of a component 34. FIG. 3 also shows that component 30 uses a supply voltage Vdd while component 34 uses a reduced supply voltage Vddr. Component 34 which can be any suitable logic device is shown to include a buffer circuit 36 having the input terminal 32a, said buffer circuit 36 is provided to convert a signal at a first voltage level from component 30 to a signal at a second voltage level for use in component 34 which uses a reduced supply voltage Vddr. Component 34 will generally have many input terminals (not shown) and will generally include an associated number of buffer circuits (not shown). In particular, input terminal 32a is shown coupled to buffer circuit 36 which includes an NMOS transistor 38 having a drain 38d, a gate 38g, and a source 38s and an NMOS transistor 40 having a drain 40d, a gate 40g, and a source 40s. Drain 38d and gate 40g are shown connected to input terminal 32a, gate 38g and drain 40d are connected to the reduced supply voltage Vddr, and source 38s is connected to source 40s and logic element 42. Logic element 42 is shown coupled to buffer circuit output terminal 32b, and includes an NMOS transistor 44 and a PMOS transistor 46 connected in a known way to form an inverter. The sources 38s, 40s of the NMOS transistors 38, 40, respectively, are connected to gates 44g, 46g of NMOS transistor 44 and PMOS transistor 46, respectively.

The logic element 42 is shown as an inverter in FIG. 3, however, it is to be understood that any logic element may be connected to buffer circuit 36. As noted above, the invention includes a voltage level conversion buffer circuit for an integrated circuit (IC) component. In the preferred embodiment, the IC component will be referred to as a low-power component, because it contains logic elements, for example, inverter 42 as shown in FIG. 3, comprising transistors using a supply voltage, referred to as a reduced supply voltage, which is lower than the voltage level of asserted signals driven as outputs by components to which input terminals of the low-power component are coupled. The buffer circuit converts an asserted input signal voltage level into a maximum allowable asserted input signal voltage level. The converted asserted signal is then provided to an input of a logic element comprising transistors using the reduced supply voltage.

The arrangement depicted in FIG. 3, prevents the gate to source voltage drop (i.e., Vgs) in transistors 44, 46 from being greater than the reduced supply voltage Vddr in order to prevent gate dielectric breakdown and other reliability problems in those transistors. The arrangement also provides an asserted signal voltage level related to the input signal voltage level provided at input terminal 32a and limited to Vddr to inverter 42 which will prevent a cross-current between the transistors 44, 46 of inverter 42 when the input signal voltage level is greater than or equal to Vddr+Vt and will prevent a back-drive current through transistor 38.

As an example, component 34 is a CMOS device having Vddr equal to 3.6 V and threshold voltage Vt equal to 0.6 V. Component 30 connected to input terminal 32a of component 34 is a different device having Vdd equal to 5 V such that the maximum asserted signal voltage level provided at input terminal 32a by component 30 will be 5 V and the deasserted signal voltage level provided at input terminal 32a will be 0 V.

Figure 1:
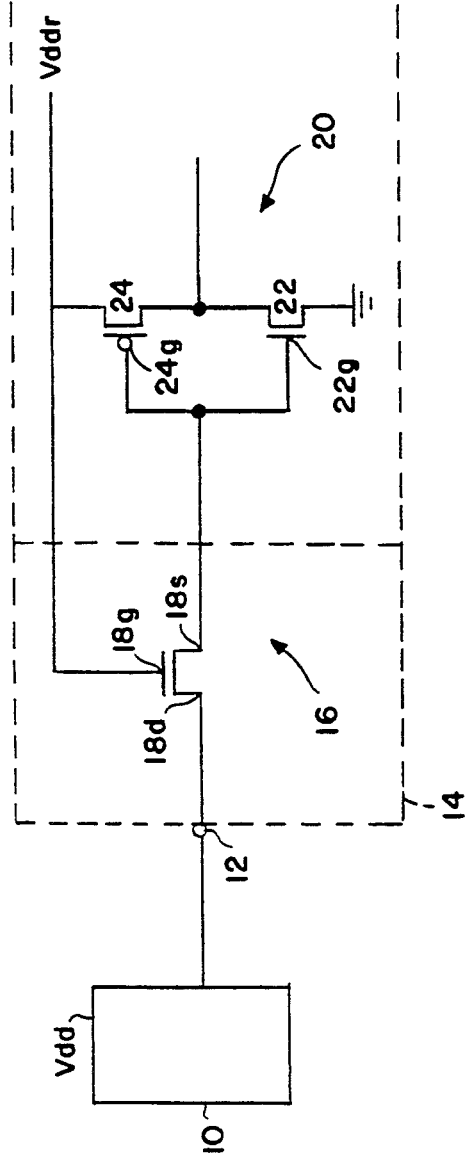
FIG. 1 is a schematic diagram of a first prior art voltage level converting buffer circuit for an integrated circuit component.
Figure 2:
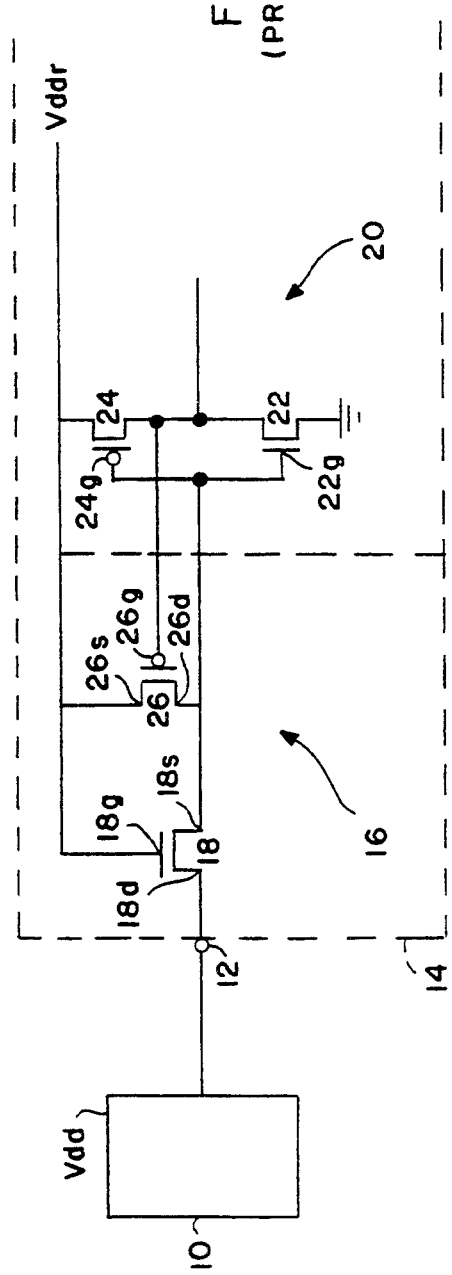
FIG. 2 is a schematic diagram of a second prior art voltage level converting buffer circuit for an integrated circuit component.

| Input Terminal Voltage Level Vin | Inverter 20 Input Voltage Level (FIG. 1) | Inverter 42 Input Voltage Level (FIG. 3) |
| --- | --- | --- |
| 0 V → Vddr − Vt | Vin | Vin |
| Vddr − Vt → Vddr | Vddr − Vt | Vddr − Vt |
| Vddr → Vddr + Vt | Vddr − Vt | Vin − Vt |
| ≧Vddr + Vt | Vddr − Vt | Vddr |

In the table above, the voltage levels provided by buffer circuit 16 to inverter 20 (FIG. 1) and by buffer circuit 36 to inverter 42 (FIG. 3) are shown when an input signal voltage level of 0 V (row 1) to ≧Vddr+Vt (row 4) is applied to input terminal 12, 32a (Vin), respectively. Only the operation of buffer circuit 36 (FIG. 3) will be discussed since the operation of buffer circuit 16 (FIG. 1) has been previously discussed in the background of the invention.

When input terminal 32a is deasserted, drain 38d of transistor 38 and gate 40g of transistor 40 are also deasserted through direct connections to input terminal 32a. Transistor 38 is "on", because the gate to source voltage drop (i.e., Vgs=3.6 V) is greater than the threshold voltage (i.e., Vt=0.6 V).

When input terminal 32a is deasserted, with the exception of the initial switching current when the transistor changes from the on state to the off state, no current flows from drain 38d to source 38s of transistor 38 and the voltage level at source 38s remains at 0 V. Transistor 40 is off, because Vgs is 0 V which is less than Vt. Thus, the voltage level at the input to inverter 42 is 0 V (i.e., Vin) as shown in the table above.

When the input signal voltage level applied to input terminal 32a changes from being deasserted to being asserted, initially, transistor 38 is on (Vgs>Vt). As input terminal 32a changes from being deasserted to being asserted, the current being conducted through transistor 38 increases the voltage level at source 38s. Thus, the voltage level at the input to inverter 42 is approximately equal to the voltage level of input terminal 32a, Vin, as shown in the table above.

Transistor 38 will remain on while Vgs is greater than Vt, and since gate 38g of transistor 38 is connected to Vddr, transistor 38 will conduct current until the voltage level at source 38s plus Vt equals Vddr (i.e., Vgs=Vt). Thus, the voltage level provided at source 38s is limited to Vddr−Vt when the asserted signal voltage level at drain 38d is greater than Vddr−Vt.

Transistor 38 prevents gate dielectric breakdown in transistors 44, 46 of inverter 42 by limiting the voltage level provided at gates 44g, 46g to a maximum of Vddr−Vt. However, the voltage limiting provided by transistor 38 alone would cause a cross-current between transistor 46 and transistor 44 when an asserted input signal voltage level is provided at input terminal 32a.

Transistor 40 will not begin conducting current until Vgs is greater than Vt (i.e., Vin≧Vddr), and because the voltage level at the source 38s of transistor 38 is increasing and is connected to source 40s of transistor 40, Vgs of transistor 40 may not be greater than Vt until the voltage level at input terminal 32a, and hence, gate 40g of transistor 40 is 3.6 V (i.e., Vddr) and rising. At this point, Vgs for transistor 40 is 0.6 V which is equal to Vt and as voltage level of gate 40g rises, transistor 40 will begin conducting current from drain 40d to source 40s. When transistor 40 turns on, the voltage level at source 40s will be increased substantially close to Vddr. The voltage level at source 40s and source 38s provided by transistor 38 prevents Vgs of transistor 40 from becoming greater than Vddr which prevents gate dielectric breakdown. As previously discussed, when Vgs equals a critical level (i.e., greater than Vddr), the critical electric field is reached which can lead to gate dielectric breakdown and other reliability problems. Vgs of transistor 40 will not reach a level greater than Vddr, because the voltage level provided at source 38s by transistor 38 is approximately 3.0 V and the voltage level provided to gate 40g of transistor 40 is approximately 5.5 V maximum. Thus, Vgs for transistor 40 is a maximum of approximately 2.5 V which is less than Vddr (i.e., 3.6 V) and thus, far less than the critical voltage level.

By providing the maximum allowable voltage level of Vddr=3.6 V to the input of inverter 42, PMOS transistor 46 will be fully off and NMOS transistor 44 will be fully on when an asserted input signal is provided to input terminal 32a. Thus, transistor 40 eliminates any cross-current between PMOS transistor 46 and NMOS transistor 44 of inverter 42.

Since transistor 40 will not increase the voltage level at source 40s to Vddr until the voltage level at input terminal 32a is greater than or equal to Vddr+Vt, the voltage level at source 38s will never be greater than the voltage level provided at input terminal 32a. This prevents a back-drive of current through transistor 38.

If the low-power component used in the example given above was connected to TTL logic components, then the asserted signal voltage level provided to input terminal 32a would be approximately 2.2 V and the deasserted signal voltage level provided to input terminal 32a would be approximately 0.8 V. In this case, buffer circuit 36 and in particular transistor 38 would provide the TTL asserted and deasserted voltage levels to the input of inverter 42, but buffer circuit 36 and in particular transistor 40 would not increase the voltage level at the input to inverter 42 to Vddr. Thus, in this case, buffer circuit 36 would not eliminate the cross-current in inverter 42, but buffer circuit 36 would substantially prevent a back-drive current through transistor 38 keeping the voltage level at the input to inverter 42 approximately equal to the voltage level applied at input terminal 32a.

Buffer circuit 36 requires very little space which is generally a critical factor in integrated circuit components. Further, buffer circuit 36 comprises the same type of transistors as the logic elements making up the component, and accordingly, the buffer circuit does not complicate the fabrication process for the component.

Additionally, the buffer circuit is readily adaptable for use with different voltages.

Having described a preferred embodiment of the invention, it will now become apparent to those of skill in the art that other embodiments incorporating its concept may be provided. It is felt, therefore, that this invention should not be limited to the disclosed embodiment, but rather should be limited only by the spirit and scope of the appended claims.

What is claimed is:

1. A voltage level conversion buffer circuit having an input and an output, comprising:
    a first transistor including a gate, a drain, and a source, said gate is connected to a supply voltage; and
    a second transistor including a gate, a drain, and a source, said drain of said second transistor is connected to said supply voltage, said gate of said second transistor is connected to said drain of said first transistor, and said source of said second transistor is connected to said source of said first transistor.

2. The buffer circuit according to claim 1, wherein said buffer circuit has the input connected to the drain of said first transistor and to the gate of said second transistor.

3. The buffer circuit according to claim 1, further comprising:
    an integrated circuit logic element, with the source of said first transistor and the source of said second transistor being connected to an input of said integrated circuit logic element.

4. The buffer circuit according to claim 3, wherein said integrated circuit logic element is an inverter.

5. The buffer circuit according to claim 3, wherein said first transistor, said second transistor, and said logic element are part of a logic component.

6. The buffer circuit according to claim 5, wherein said component uses said supply voltage.

7. The buffer circuit according to claim 1, wherein said first and said second transistors are N-channel metal-oxide-semiconductor field-effect transistors.

8. The buffer circuit according to claim 2, further comprising:
    a driving component connected to said input terminal, with said driving component being capable of providing a signal to said input terminal having a voltage level greater than said supply voltage.

9. In combination:
    a driving component using a first voltage supply Vdd;
    a voltage level conversion buffer circuit comprising:
        a first transistor including a gate, a drain, and a source; and
        a second transistor including a gate, a drain, and a source, said gate of said second transistor is connected to said drain of said first transistor to provide an input of said buffer circuit, and said source of said second transistor is connected to said source of said first transistor to provide an output of said buffer circuit, and wherein said input of said buffer circuit is coupled to said driving component; and
    a logic element including an input coupled to said output of said buffer circuit, and wherein said logic element uses a second supply voltage which is less than said first supply voltage and said gate of said first transistor and said drain of said second transistor are coupled to said second supply voltage.

* * * * *